United States Patent
Taft et al.

(10) Patent No.: US 10,116,319 B2
(45) Date of Patent: Oct. 30, 2018

(54) RESISTIVE INTERPOLATION FOR AN AMPLIFIER ARRAY

(71) Applicant: TEXAS INSTRUMENTS INCORPORATED, Dallas, TX (US)

(72) Inventors: Robert Callaghan Taft, Munich (DE); Alexander Bodem, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/911,141

(22) Filed: Mar. 4, 2018

(65) Prior Publication Data

US 2018/0254780 A1    Sep. 6, 2018

Related U.S. Application Data

(60) Provisional application No. 62/466,978, filed on Mar. 3, 2017.

(51) Int. Cl.
    *H03M 1/78*     (2006.01)
    *H03M 1/20*     (2006.01)
    (Continued)

(52) U.S. Cl.
    CPC .............. *H03M 1/203* (2013.01); *H03F 3/19* (2013.01); *H03F 3/45475* (2013.01); *H03M 1/1245* (2013.01); *H03F 2200/451* (2013.01)

(58) Field of Classification Search
    CPC ...... H03M 1/765; H03M 1/682; H03M 1/785; H03M 1/687; H03M 1/00; H03M 1/204; H03M 1/205; H03M 1/12

(Continued)

(56) References Cited

U.S. PATENT DOCUMENTS

| | | | | |
|---|---|---|---|---|
| 5,805,096 A | * | 9/1998 | Morisson | ............... H03M 1/205 341/155 |
| 6,407,692 B1 | * | 6/2002 | Bult | .................... H03M 1/0646 341/159 |

(Continued)

OTHER PUBLICATIONS

PCT Search Report for Application No. PCT/US 2018/020946, dated Jun. 14, 2018.

*Primary Examiner* — Linh Nguyen
(74) *Attorney, Agent, or Firm* — Andrew Viger; Charles A. Brill; Frank D. Cimino

(57) ABSTRACT

A circuit including an amplifier array including an amplifier stage with M amplifiers (M≥2), connected to a resistor interpolator (interpolation order N≥2) including an input row and at least a second row, each row comprising interpolation resistors connected in series at nodes. The input row including M driven nodes connected to a respective amplifier, and connected in parallel to the second row, with at least some first-row interpolation nodes connected to corresponding second-row interpolation nodes. The resistor interpolator comprising at least one multi-row interpolation cell, with: in the input row, a driven node coupled through first and second interpolation resistors to respective adjacent first and second interpolation nodes; and in the second row, third and fourth interpolation nodes coupled through third and fourth interpolation resistors to an intermediate fifth interpolation node; and with the first and second interpolation nodes connected respectively to the third and fourth interpolation nodes.

19 Claims, 7 Drawing Sheets

(51) Int. Cl.
*H03M 1/12* (2006.01)
*H03F 3/45* (2006.01)
*H03F 3/19* (2006.01)

(58) Field of Classification Search
USPC .................................................. 341/154, 155
See application file for complete search history.

(56) References Cited

U.S. PATENT DOCUMENTS

| | | | |
|---|---|---|---|
| 6,570,523 B1 * | 5/2003 | Bacrania | H03M 1/165 341/154 |
| 6,707,413 B2 | 3/2004 | Sushihara et al. | |
| 6,822,600 B1 | 11/2004 | Taft et al. | |
| 6,847,320 B1 * | 1/2005 | Taft | H03M 1/0646 341/120 |
| 6,937,178 B1 * | 8/2005 | Rempfer | H03M 1/0678 341/144 |
| 7,046,179 B1 | 5/2006 | Taft et al. | |
| 7,102,424 B2 * | 9/2006 | Vorenkamp | H03M 1/0602 327/104 |
| 7,417,572 B1 * | 8/2008 | Williams | H03M 1/747 341/136 |
| 9,214,950 B1 * | 12/2015 | Davis | H03M 1/0621 |
| 2002/0067301 A1 * | 6/2002 | Steinbach | H03M 1/146 341/156 |
| 2002/0093447 A1 * | 7/2002 | Li | H03M 1/141 341/158 |
| 2008/0316078 A1 * | 12/2008 | Iijima | H03M 1/682 341/145 |
| 2010/0085232 A1 * | 4/2010 | Nicolas | H03M 1/362 341/159 |
| 2010/0271249 A1 * | 10/2010 | Nakajima | H03M 1/002 341/159 |

* cited by examiner

RESISTIVE INTERPOLATION FOR AN AMPLIFIER ARRAY

CROSS-REFERENCE TO RELATED APPLICATIONS

Priority is claimed under 37 CFR 1.78 and 35 USC 119(e) to U.S. Provisional Application 62/466,978, filed 2017 Mar. 3, which is incorporated in its entirety by reference.

BACKGROUND

Analog-to-digital converters such as flash and folding use amplifier arrays to parallel process an input value. Interpolation can be used to generate intermediate values between two adjacent amplifiers in the array. For example, in a folding ADC architecture, folding can be used to reduce component count (such as the number of comparators), and the folded amplifier array output can be interpolated to recover resolution.

Resistive interpolation uses two or more resistors between adjacent amplifiers to provide one or more interpolation (intermediate) values between the amplifier-driven outputs. FIG. 1A illustrates a portion of a two-stage cascaded resistor interpolator, providing interpolation-by-3. The schematic can represent single-ended signals, or polarities of differential signals.

Stage N amplifiers A1 and A2 drive nodes D1 and D2, with the series-coupled interpolation resistors R/R'/R providing intermediate interpolation nodes I1 and I2. The interpolation resistors need not be of the same resistance value, as indicated by R and R'.

The Stage N amplifier-driven nodes D1/D2 and interpolation nodes I1/I2 provide the Stage N driven and interpolated outputs. The Stage N outputs are inputs to the Stage N+1 amplifiers at driven nodes, with interpolated nodes in between.

FIG. 1B illustrates voltage inputs for amplifiers A1 and A2, $V_{IN,1}$ and $V_{IN,2}$, and the resulting outputs: driven outputs $V_{OUT,D1}$ and $V_{OUT,D2}$ from the driven nodes D1 and D2; and interpolation (intermediate) outputs $V_{OUT,I1}$ and $V_{OUT,I2}$ from the interpolated nodes I1 and I2. The interpolated voltages $V_{OUT,I1}$ and $V_{OUT,I2}$ have values intermediate the amplifier outputs $V_{OUT,D1}$ and $V_{OUT,D2}$.

FIG. 1C illustrates the two-stage resistor interpolator with the stage nodes aligned (and numbered). As configured, a Stage N amplifier/node A6/6 drives the corresponding Stage N+1 amplifier/node A6/6 with a driven output, and the adjacent Stage N interpolation nodes 5 and 7 drive the Stage N+1 amplifier/nodes A3/3 and A9/9 with interpolated outputs, with interpolation resistors/nodes between the driven nodes.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

According to aspects of the Disclosure, an amplifier array includes an amplifier stage connected to a resistor interpolator. The amplifier stage includes M amplifiers (M≥2). The resistor interpolator is configured to provide an interpolation order N (N≥2), and includes an input row and at least a second row, each row comprising multiple interpolation resistors connected in series at nodes. The input row includes M driven nodes connected to a respective amplifier, and (N−1) interpolation nodes intermediate each of adjacent driven nodes. The input row is connected in parallel to the second row, with at least some of the interpolation nodes of the first row connected to corresponding interpolation nodes of the second row. The resistor interpolator including at least one multi-row interpolation cell, comprising: in the input row, a driven node connected to first and second interpolation resistors connected between the driven node and respective adjacent first and second interpolation nodes; and in the second row, third and fourth interpolation resistors connected between respective third and fourth interpolation nodes and an intermediate fifth interpolation node; and with the first and second interpolation nodes of the input row connected respectively to the third and fourth interpolation nodes of the second row.

In other aspects of the Disclosure, a circuit for analog-to-digital conversion includes at least one folding interpolated amplifier array with a folding amplifier stage, and a resistive interpolation stage. The folding amplifier stage includes M amplifiers (M≥4), each coupled to the input terminal to receive the input value, the M amplifiers configured with a folding factor of N (N≥2) to provide M/N amplifier stage outputs. A resistor interpolator is coupled to receive the M/N amplifier stage outputs, and is configured to provide an interpolation order N (N≥2), and includes an input row and at least a second row, each row comprising multiple interpolation resistors connected in series at nodes. The input row includes M/N driven nodes connected to a respective amplifier, and (N−1) interpolation nodes intermediate each of adjacent driven nodes. The input row is connected in parallel to the second row, with at least some of the interpolation nodes of the first row connected to corresponding interpolation nodes of the second row. The resistor interpolator including at least one multi-row interpolation cell, including: in the input row, a driven node connected to first and second interpolation resistors connected between the driven node and respective adjacent first and second interpolation nodes; and in the second row, third and fourth interpolation resistors connected between respective third and fourth interpolation nodes and an intermediate fifth interpolation node; and with the first and second interpolation nodes of the input row connected respectively to the third and fourth interpolation nodes of the second row.

Other aspects and features of the invention claimed in this Patent Document will be apparent to those skilled in the art from the following Disclosure.

BRIEF DESCRIPTION OF THE DRAWINGS

FIG. 1A illustrates a portion of a two-stage resistor interpolator configured for interpolation-by-three with three interpolation resistors [R/R'/R] and two interpolation nodes, with Stage N including amplifier-driven nodes [A1/D1, A2/D2] and intermediate interpolation nodes [I1, I2], which together drive Stage N+1 amplifiers; FIG. 1B illustrates amplifier input voltages [A1/$V_{IN,1}$, A2/$V_{IN,2}$], and resulting driven voltage outputs [$V_{OUT,D1}$, $V_{OUT,D2}$], and interpolation (intermediate) voltage outputs [$V_{OUT,I1}$, $V_{OUT,I2}$]; and FIG. 1C illustrates a portion of a two-stage resistor interpolator with the stage nodes aligned, including a Stage N driven amplifier/node [A6/6] that drives the corresponding Stage N+1 driven amplifier/node [A6/6], and adjacent Stage N interpolation nodes [5, 7] that drive the Stage N+1 amplifier/nodes [A3/3, A9/9].

Figure 1A:
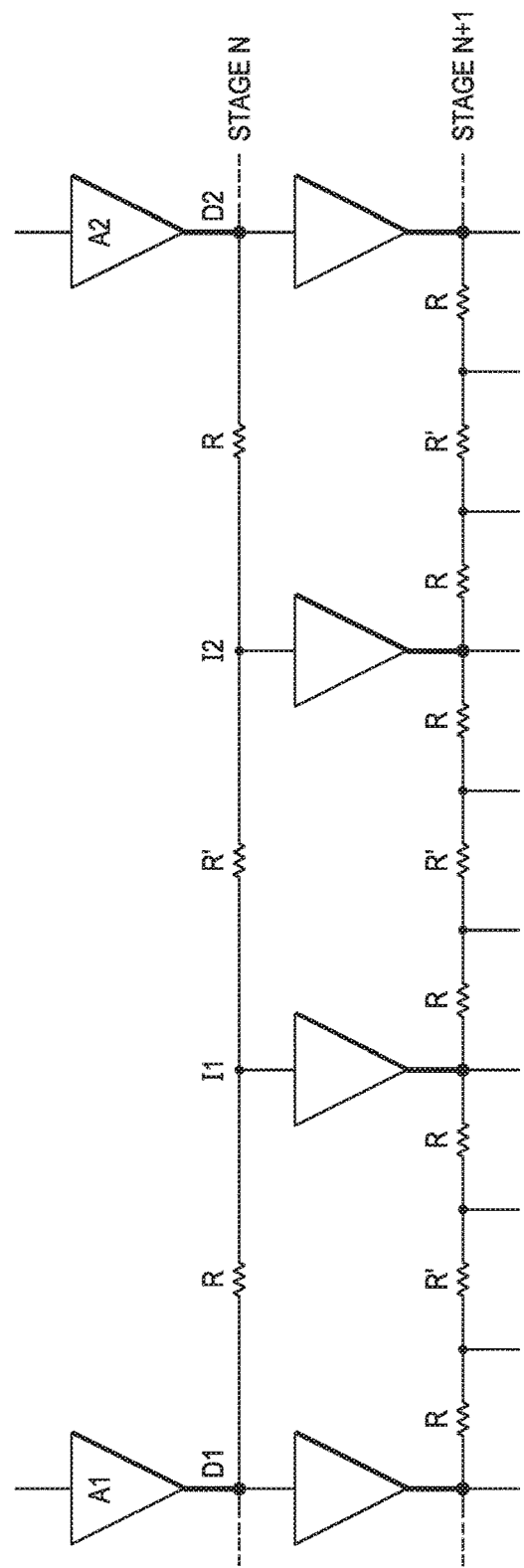
FIGS. 1A, 1B, 1C illustrate resistive interpolation.
Figure 1B:
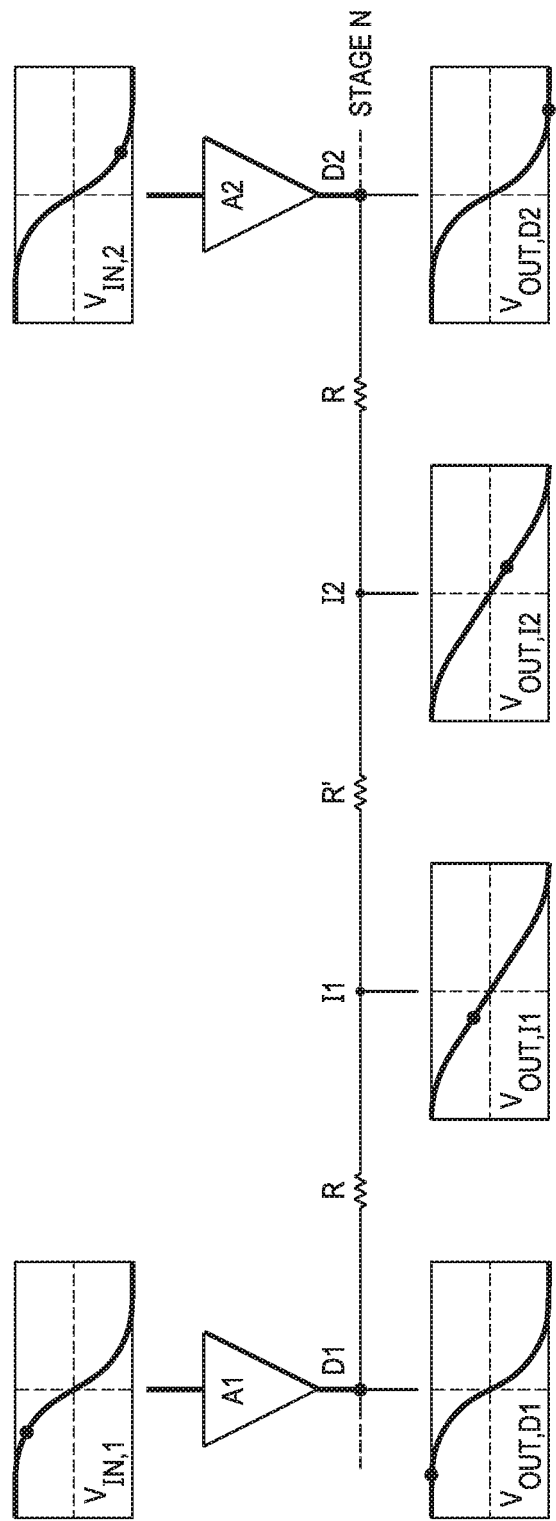
Figure 1C:
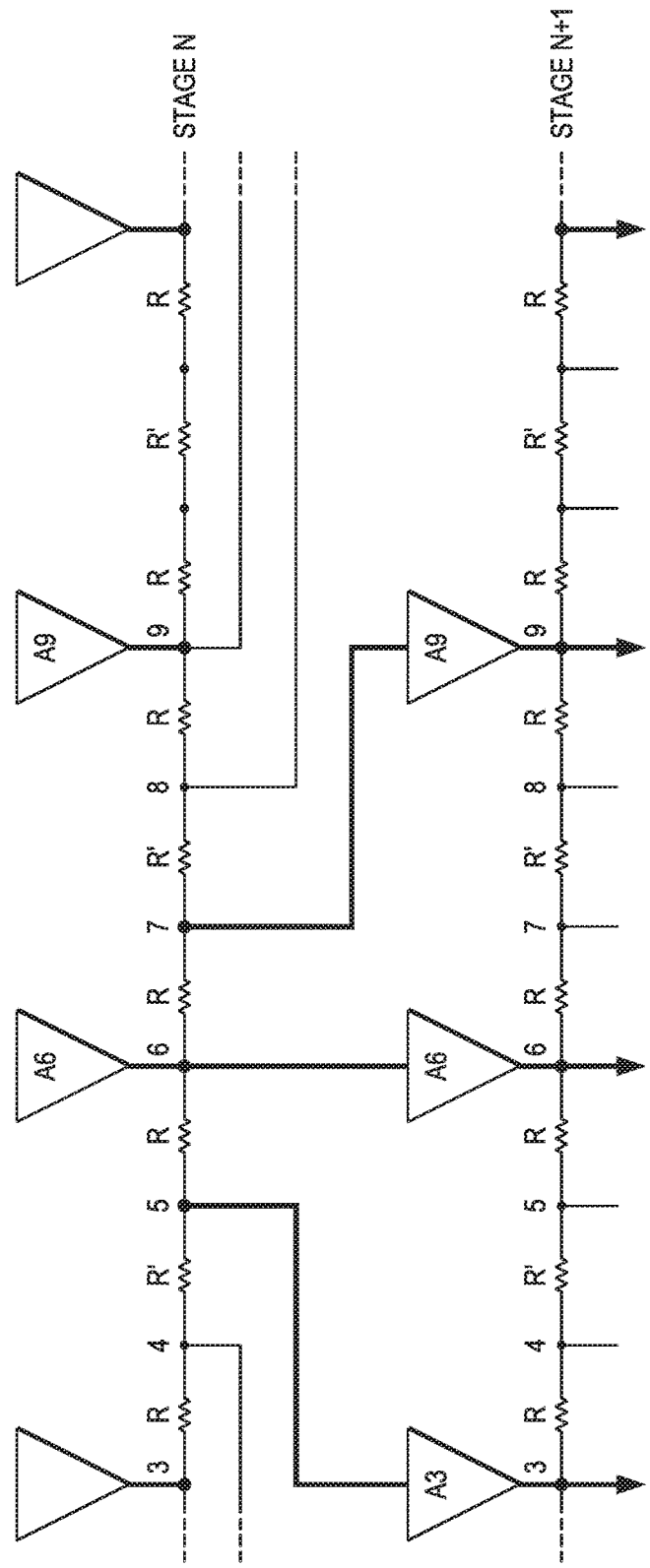
Figure 2:
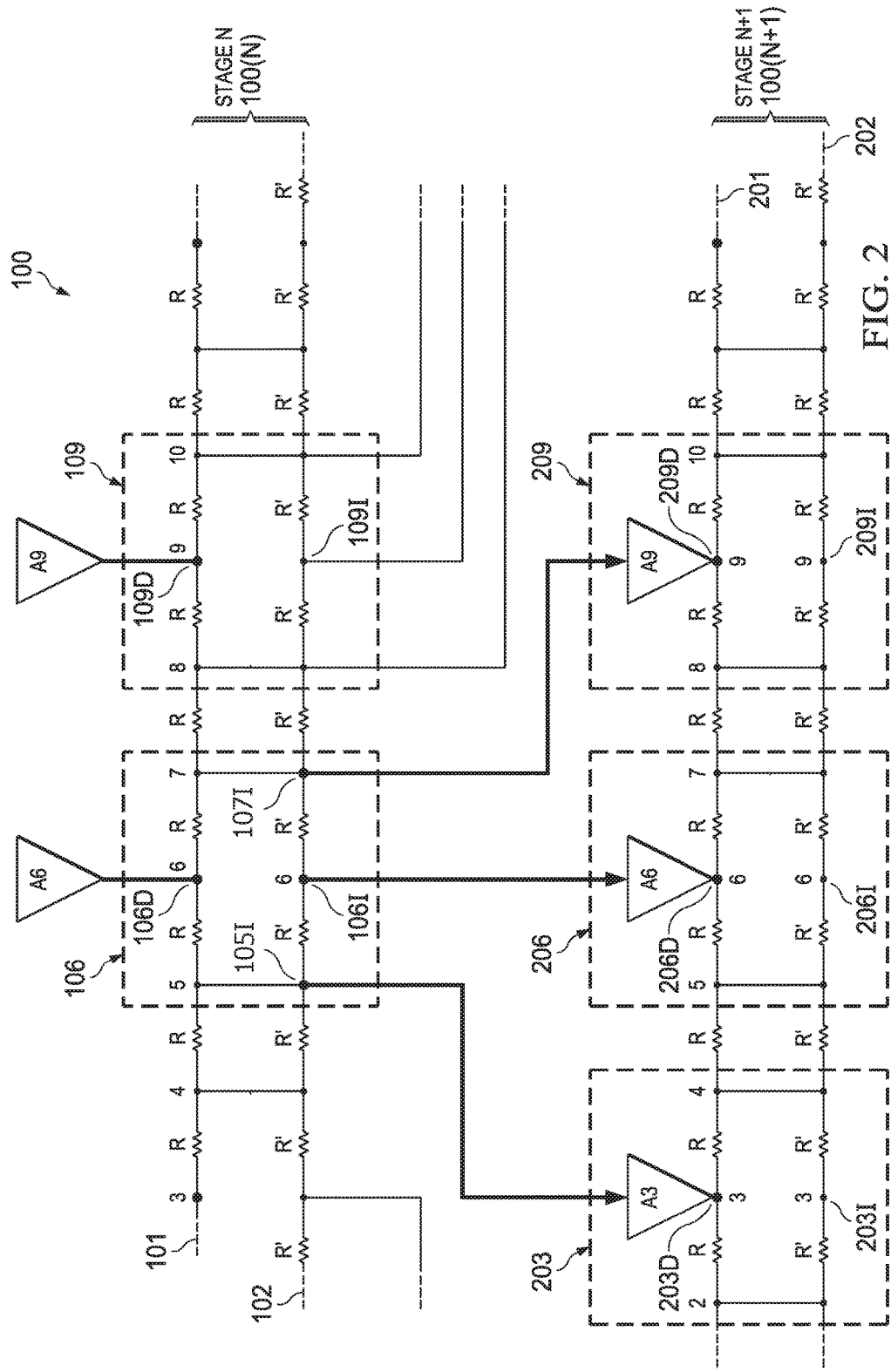

FIG. 2 illustrates an example amplifier array with multi-row resistive interpolation according to the Disclosure, including example cascaded multi-stage amplifier arrays [Stages N, N+1], each amplifier array including a multi-row resistor interpolator [100(N), 101/102; 100(N+1), 201/202], illustratively configured with interpolation order three, including multi-row interpolation cells [100(N), 106/109; 100(N+1), 203/206/209] in which an input-row driven node [106/106D] is not connected to a corresponding second/next-row node [106/106I], so that the non-driven node [106/106I] is an interpolation between adjacent interpolation nodes [106, 105I/107I].

Figure 3A:
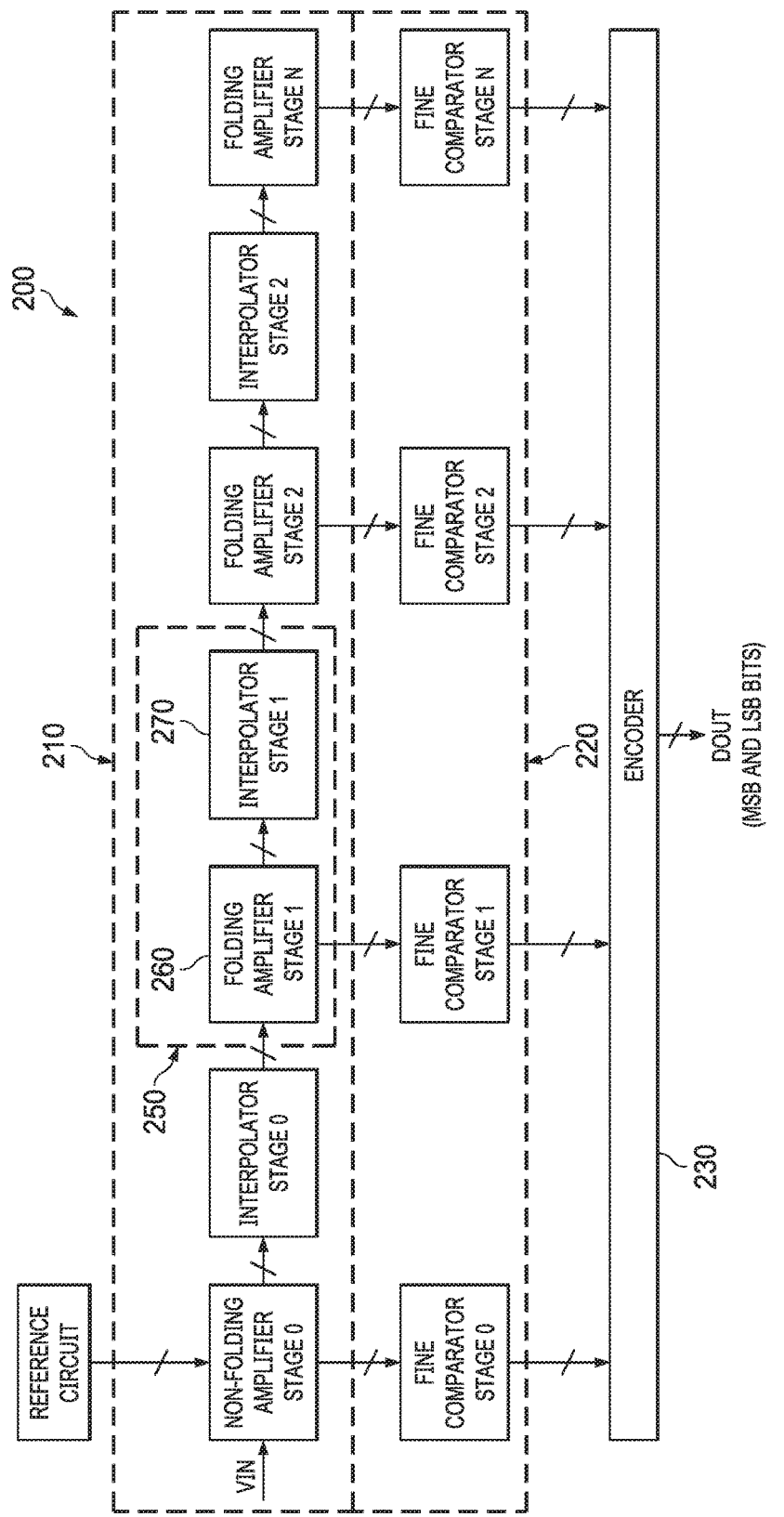

FIG. 3A illustrates an example folding ADC [200] including cascaded folding amplifier array stages [210], and including an example stage 1 folding interpolated amplifier array [250], with a folding amplifier stage [260], and a resistor interpolator stage [270] that is configured according to the Disclosure for multi-row resistive interpolation with multi-row interpolation cells.

Figure 3B:
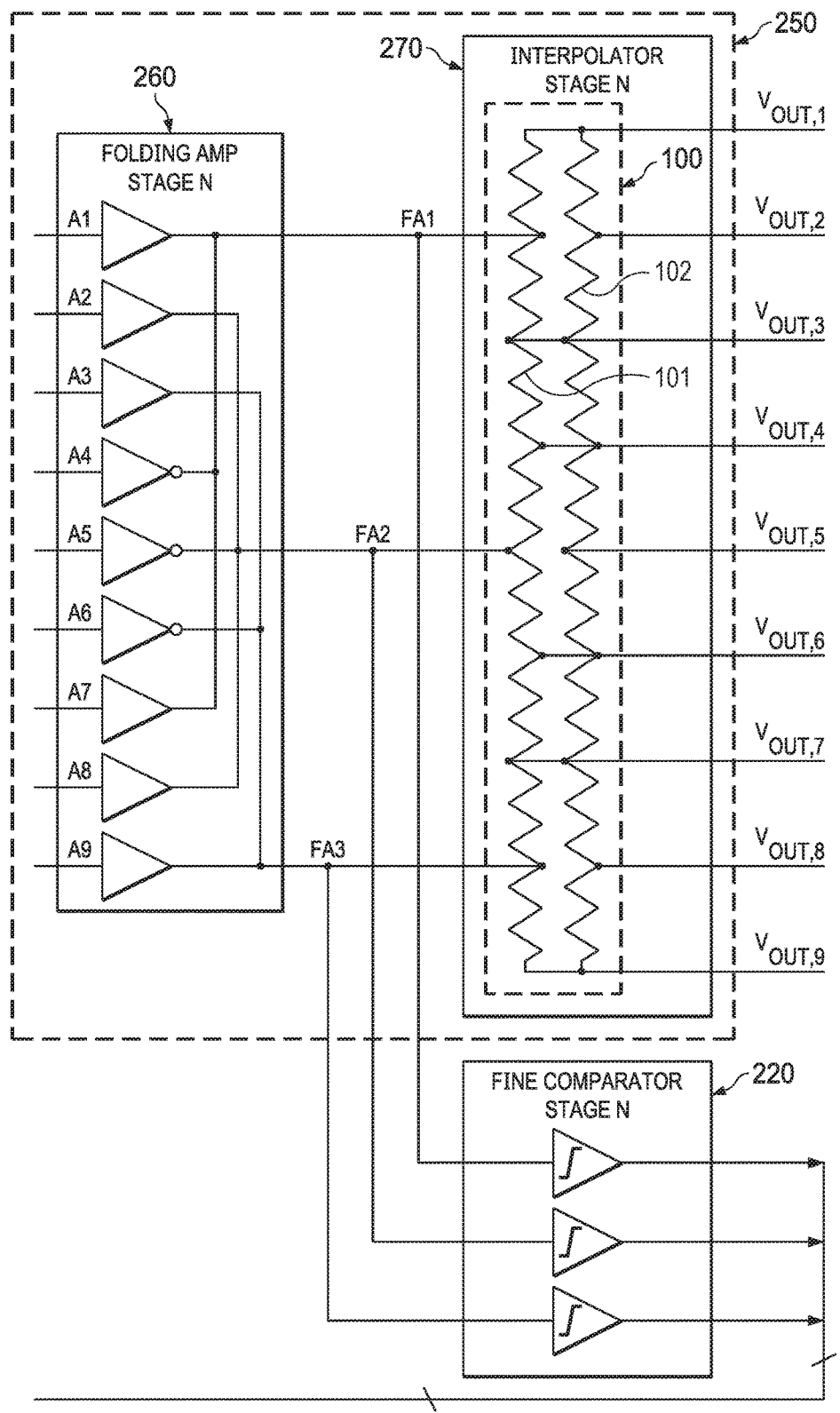

FIG. 3B illustrates an example folding interpolated amplifier array [250], such as implemented in the folding ADC of FIG. 3A, the amplifier array including an example folding amplifier stage with amplifier inputs A1-A9 and configured for folding-by-3 [A1/A4/A7, A2/A5/A8, A3/A6/A9] to provide folded amplifier outputs [FA1, FA2, FA3], which are interpolated by an example interpolation-by-3 multi-row resistor interpolator stage [270, 100] to provide amplifier array outputs $V_{OUT,1}$-$V_{OUT,9}$ (corresponding to the A1-A9 amplifier inputs), which are all interpolated according to the Disclosure.

Figure 4:
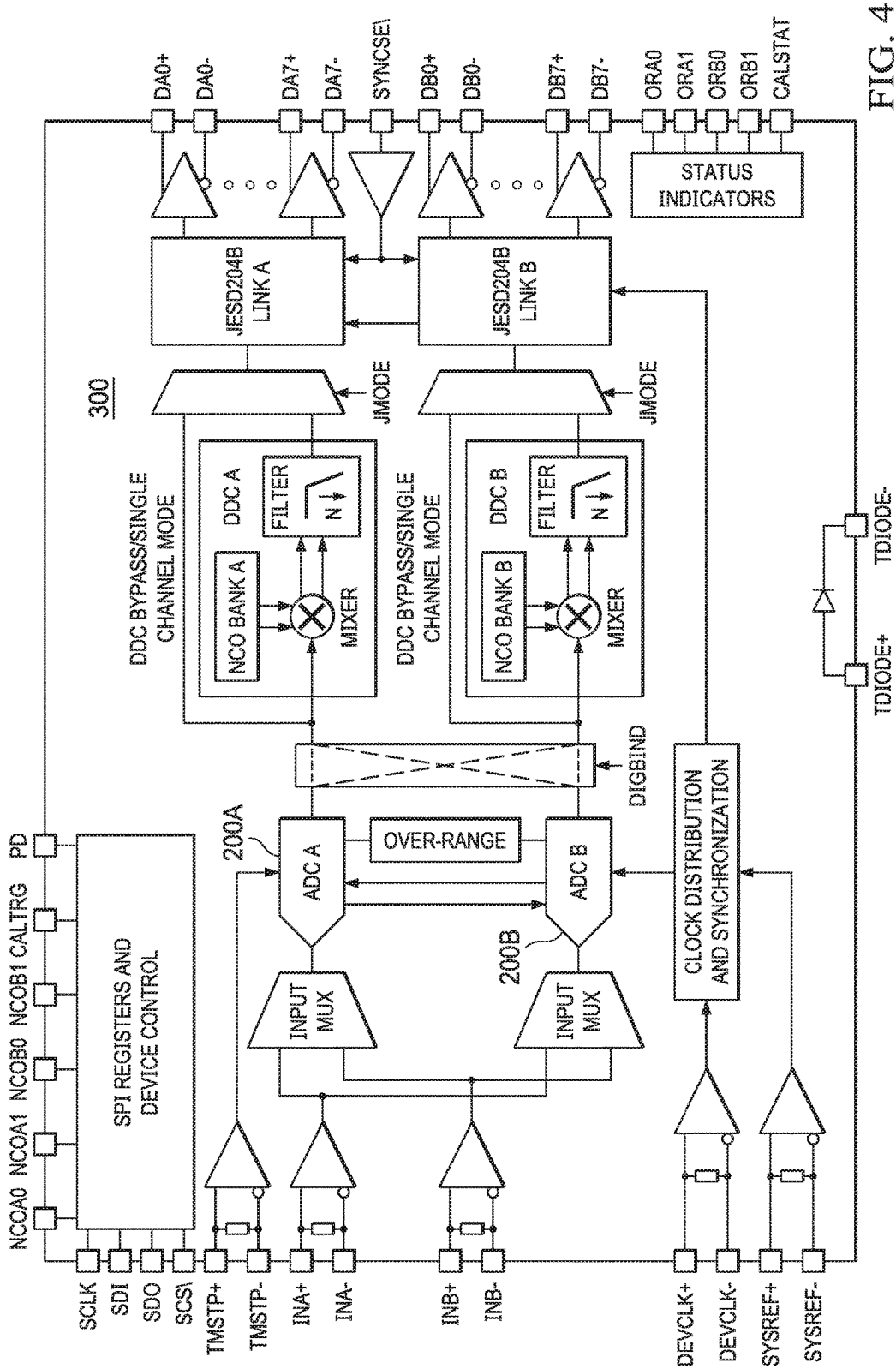

FIG. 4 illustrates an example RF Sampling ADC [300] with dual folding ADCs [200A, 200B], which can be implemented as in FIGS. 3A/3B, including with folding interpolated amplifier arrays [FIG. 3A/3B, 250], configured according to the Disclosure for multi-row resistive interpolation [FIG. 3B, 270, 100] with multi-row interpolation cells implemented as in FIG. 2.

DETAILED DESCRIPTION

This Description and the Drawings constitute a Disclosure for an amplifier array with multi-row resistive interpolation, including describing design examples (example implementations), and illustrating various technical features and advantages.

This Disclosure uses the following nomenclature. An array of amplifiers means M amplifiers (M≥2) that parallel process an input value. Interpolation-by-N means interpolation to generate (N−1) intermediate values between two adjacent amplifiers in an array, so as to increase the number of output values in the array from M driven outputs to M×N total outputs (for closed loop interpolation). Cascading amplifier arrays means placing two or more amplifier arrays in sequence, and using the output of one amplifier array to drive the input to a next amplifier array.

In brief overview, an amplifier array including an amplifier stage with M amplifiers (M≥2), connected to a resistor interpolator (interpolation order N≥2) including an input row and at least a second row, each row comprising interpolation resistors connected in series at nodes. The input row including M driven nodes connected to a respective amplifier, and connected in parallel to the second row, with at least some first-row interpolation nodes connected to corresponding second-row interpolation nodes. The resistor interpolator comprising at least one multi-row interpolation cell, with: in the input row, a driven node coupled through first and second interpolation resistors to respective adjacent first and second interpolation nodes; and in the second row, third and fourth interpolation nodes coupled through third and fourth interpolation resistors to an intermediate fifth interpolation node; and with the first and second interpolation nodes connected respectively to the third and fourth interpolation nodes. Multi-row resistive interpolation with multi-row interpolation cells according to the Disclosure increases interpolation linearity by increasing uniformity in gain and impedance between output interpolation nodes.

FIG. 2 illustrates an example amplifier array with multi-row resistive interpolation according to the Disclosure. The amplifier array is implemented in an example cascade 100 of amplifier arrays represented by portions of Stage N and Stage N+1 amplifier arrays.

Each of the Stage N and N+1 amplifier arrays includes an amplifier stage, and a multi-row resistor interpolator stage.

The example Stage N amplifier stage is illustrated with amplifiers A6, and A9, interconnected to an associated multi-row resistor interpolator stage 100(N) as shown, and as described below. The example Stage N+1 amplifier stage is illustrated with amplifiers A3, A6 and A9, interconnected to an associated multi-row resistor interpolator stage 100(N+1) as shown, and as described below.

The example resistor interpolators 100(N) and 100(N+1) are illustrated with two parallel-connected interpolator rows 101/102 and 201/202, with interconnect as shown, and as described below. Interpolator rows 101 and 201 are designated as input rows, and interpolator rows 102 and 202 are designated as second (next) rows. The example Stage N and N+1 resistor interpolators are illustratively configured for interpolation-by-3 (interpolation order three).

The Stage N amplifiers A6, A9 are connected to the input row 101 of the example resistor interpolator 100(N), driving inputs to nodes 6, and 9. The Stage N+1 amplifiers A3, A6, A9 are connected to the input row 201 of the example resistor interpolator 100(N+1), driving inputs to nodes 3, 6, and 9. For the example resistor interpolators 100(N) and 100(N+1), the second rows 102 and 202 provide the outputs for the associated amplifier array. According to aspects of the Disclosure, as described below, all of the amplifier array outputs are interpolated.

The amplifier arrays can represent a single-ended design, or one half of a differential design. The resistor interpolator can be implemented as an open loop or closed loop design. For an open loop configuration, the outside nodes are not interpolated, and will be driven nodes.

Each of the multi-row resistor interpolators 100(N) and 100(N+1) are configured with multi-row interpolation cells according to the Disclosure. Resistor interpolator 100(N) illustratively includes interpolation cells 106 and 109. Resistor interpolator 100(N+1) illustratively includes interpolation cells 203, 206 and 209.

Example interpolation cell 106 includes in the input row 101 a driven node 106D (node 6) driven by amplifier A6, and adjacent interpolation nodes 5 and 7. The input row interpolation nodes 5 and 7 of interpolation cell 106 adjacent driven node 106D are connected to corresponding interpolation nodes 105I and 107I of the second interpolation row 102.

According to aspects of the Disclosure, the driven node 106D of the input interpolation cell 106 is not connected to the corresponding node 106I of the second interpolation row 102. As a result, node 106I provides an interpolation between the adjacent interpolation nodes 105I and 107I of the interpolation cell 106. That is, the outputs from interpolation cell 106 are all interpolation nodes: 106I and the adjacent interpolation nodes 105I and 107I.

Stage N interpolation cell 106 in the resistor interpolator 100(N) provides inputs to the Stage N+1 amplifier stage, amplifiers A3, A6, and A9 driving nodes 3, 6, and 9. Stage N interpolation node 106I provides input to amplifier A6 driving node 206D in the input row 201 for the Stage N+1 resistor interpolator 100(N+1), within an interpolation cell 206. Stage N interpolation nodes 105I and 107I provide input to amplifiers A3 and A9 driving nodes 203D and 209D of the of the Stage N+1 input row 201 of the resistor interpolator 100(N+1), within interpolation cells 203 and 209.

The interconnect and functionality of interpolation cells 203, 206 and 209 is identical to that of the described interpolation cell 106. In particular, the input row 201 driven nodes 203D, 206D, 209D are not connected to the corresponding nodes 203I, 206I, 209I of the second row 202. As a result, as with the interpolation cell 106, the outputs from these cells are all interpolations based on the adjacent interpolation nodes.

For the illustrated example cascaded amplifier array with multi-row resistive interpolation, using interpolation cells according to the Disclosure, the number of outputs increases due to interpolation. For example, interpolation cell 106 receives input from amplifier A6 at node 106D (input row 101), and provides three (interpolated) outputs from the second (next or output) row 102: 106I, and 105I/107I. As described further in connection with the folding interpolated ADC implementation illustrated in FIGS. 3A/3B, the amplifier stages can be implemented with folding, for example folding-by-3 to reduce the number of inputs 3X, followed by interpolation-by-3 provided by the multi-row resistive interpolation stages, so that the number of outputs is the same as the number of inputs, and the total parallel signals at each stage stays nearly constant.

An advantage of multi-row resistive interpolation with multi-row interpolation cells according to the Disclosure is to match the gain at driven and interpolated nodes, by not using the output of the amplifiers directly. Instead, the multi-row interpolation cell effectively replaces a higher-gain driven with an interpolation node by interpolating between the two adjacent interpolated nodes, which drops the gain to nearly a constant value for the output nodes. This interpolation cell design matches output impedance for the outputs (interpolated) of the resistor interpolator, improving matching of settling time and linearity. The improvement in linearity increases as stages are cascaded.

These advantages are even more significant for designs in which the amplifiers are open loop and therefore non-linear. As a result, the difference in gain between the driven nodes and the interpolated nodes becomes more pronounced, as the entire transfer curve becomes more non-linear.

The example amplifier array described in connection with FIG. 2 includes an example multi-row resistor interpolator with two interpolation rows (input and second). Additional interpolation rows can be used to increase gain uniformity between output nodes, and thereby increase linearity. Increasing the number of rows involves design trade-offs in terms of area, parasitic capacitance, power and speed.

FIG. 3A illustrates an example folding ADC 200 including cascaded folding amplifier array stages 210. Such a folding ADC design is described in U.S. Pat. No. 7,710,305 "Unified Architecture for Folding ADC", the disclosure of which is incorporated in its entirety.

A folding ADC 200 includes, in addition to folding amplifier array stages 210, associated distributed (fine) comparator stages 220, and an encoder 230. An example folding interpolated amplifier array 250 includes a folding amplifier stage 260, and a resistor interpolator stage 270. The resistor interpolator 270 can be configured according to the Disclosure for multi-row resistive interpolation with multi-row interpolation cells.

FIG. 3B illustrates an example design for the folding interpolated amplifier array 250 in FIG. 3A. Amplifier array 250 includes a folding amplifier stage 260 with amplifier inputs A1-A9. The folding amplifier stage 260 is configured for folding-by-3, with amplifiers A1/A4/A7 folded to provide a folded amplifier output FA1, amplifiers A2/A5/A8 folded to provide folded amplifier output FA2, and amplifiers A3/A6/A9 folded to provide folded amplifier output FA3.

The folded amplifier outputs FA1, FA2, FA3 are interpolated by an example interpolation-by-3 resistor interpolator stage 270. Resistor interpolator stage 270 includes a multi-row resistor interpolator design 100, such as described in connection with FIG. 2.

The example multi-row resistor interpolator 100 includes an input row 101, and a second (output) row 102. Input row 101 includes driven nodes connected to receive the folded amplifier outputs FA1-FA3. The resistor interpolator 100 provides amplifier array outputs $V_{OUT,1}$-$V_{OUT,9}$, all of which are interpolated, i.e., output from interpolated nodes of the second (output) row 102 none of which are directly driven by the folded amplifier inputs FA1-FA3 to the resistor interpolator.

In particular, resistor interpolator 100 includes interpolation cells (such as FIG. 2, 106) centered at $V_{OUT,2}$, $V_{OUT,5}$, and $V_{OUT,8}$. That is, these interpolation cell output nodes (such as FIG. 2, 106I) are interpolated according to the Disclosure, eliminating directly driven nodes with lower impedance and different linearity.

As illustrated, the example resistor interpolator 100 implies a closed loop configuration because it interpolates two more values $V_{OUT,1}$ and $V_{OUT,9}$. However, the closed loop is not explicitly shown as a connection between the top and bottom of the resistor strings 101 and 102.

The folding amplifier stage 260 results in a 3× reduction between the number of amplifier inputs A1-A9, and folded amplifier outputs FA1-FA3 to the resistor interpolator stage 270. Interpolation in the resistor interpolation stage 270 offsets the reduction in resolution resulting from folding in the amplifier stage, providing a 3×-interpolation increase in the number of outputs based on the folded inputs FA1-FA3.

FIG. 4 illustrates an example RF Sampling ADC 300 with dual folding ADCs 200A, 200B, which can be implemented as in FIGS. 3A/3B, including with folding interpolated amplifier arrays, which can be configured according to the Disclosure for multi-row resistive interpolation with multi-row interpolation cells.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A circuit including a resistive interpolator, comprising:
an input terminal to receive an input value;
an amplifier array, including
an amplifier stage with M amplifiers (M≥2), each coupled to the input terminal to receive the input value;
a resistor interpolator configured to provide an interpolation order N (N≥2), and including
an input row and at least a second row, each row comprising multiple interpolation resistors connected in series at nodes,
the input row including M driven nodes connected to a respective amplifier, and (N−1) interpolation nodes intermediate each of adjacent driven nodes, and
the input row connected in parallel to the second row, with at least some of the interpolation nodes of the first row connected to corresponding interpolation nodes of the second row;
the resistor interpolator including at least one multi-row interpolation cell, comprising:
in the input row, a driven node connected to first and second interpolation resistors connected between the driven node and respective adjacent first and second interpolation nodes;
in the second row, third and fourth interpolation resistors connected between respective third and fourth interpolation nodes and an intermediate fifth interpolation node;
the first and second interpolation nodes of the input row connected respectively to the third and fourth interpolation nodes of the second row.

2. The circuit of claim 1, wherein the input row includes M interpolation cells, each including a respective one of the M driven nodes, so that the second row includes zero driven nodes.

3. The circuit of claim 1, wherein the input row and the second row are configured for open loop interpolation, with
the input row and the second row each including [(M−1)×N] interpolation resistors connected in series at [((M−1)×N)+1] nodes.

4. The circuit of claim 1, wherein the input row and the second row are configured for closed loop interpolation, with
the input row and the second row each including (M×N) interpolation resistors connected in series at (M×N) nodes.

5. The circuit of claim 1, wherein the interpolation resistors do not all have the same resistance value.

6. The circuit of claim 1, wherein the input value is a differential input value, the interpolation resistors are differential interpolation resistors, and the amplifier stage is a differential amplifier stage with M differential amplifiers or 2×M single-ended amplifiers.

7. The circuit of claim 1, further comprising multiple cascaded interpolation stages:
each interpolation stage comprising the amplifier array and the resistor interpolator;
each interpolation stage except the last interpolation stage having its output nodes coupled as inputs to respective amplifiers of a next interpolation stage.

8. The circuit of claim 1, wherein the number of amplifiers M is greater than the number of driven nodes, and at least some of the amplifier outputs are connected to respective driven nodes with a folding factor to couple multiple amplifiers to the driven node.

9. The circuit of claim 1, wherein the circuit is an analog-to-digital converter (ADC).

10. The circuit of claim 9, wherein the ADC includes at least one amplifier array is a folded amplifier array in which the number of amplifiers M is greater than the number of driven nodes, and at least some of the amplifier outputs are connected to respective driven nodes with a folding factor to couple multiple amplifiers the driven node.

11. The circuit of claim 10, wherein:
the amplifier array is configured with folding factor of three; and
the resistor interpolator is configured with an interpolation order of three.

12. A circuit for analog-to-digital conversion, comprising:
an input terminal to receive an input value;
at least one folding interpolated amplifier array, including
a folding amplifier stage with M amplifiers (M≥4), each coupled to the input terminal to receive the input value, the M amplifiers configured with a folding factor of N (N≥2) to provide M/N amplifier stage outputs;
a resistor interpolator coupled to receive the M/N amplifier stage outputs, and configured to provide an interpolation order N (N≥2), and including
an input row and at least a second row, each row comprising multiple interpolation resistors connected in series at nodes,
the input row including M/N driven nodes connected to a respective amplifier, and (N−1) interpolation nodes intermediate each of adjacent driven nodes, and
the input row connected in parallel to the second row, with at least some of the interpolation nodes of the first row connected to corresponding interpolation nodes of the second row;
the resistor interpolator including at least one multi-row interpolation cell, comprising:
in the input row, a driven node connected to first and second interpolation resistors connected between the driven node and respective adjacent first and second interpolation nodes;
in the second row, third and fourth interpolation resistors connected between respective third and fourth interpolation nodes and an intermediate fifth interpolation node;
the first and second interpolation nodes of the input row connected respectively to the third and fourth interpolation nodes of the second row.

13. The circuit of claim 12, wherein the input row includes M/N interpolation cells, each including a respective one of the M driven nodes, so that the second row includes zero driven nodes.

14. The circuit of claim 12, wherein the input row and the second row are configured for one of open loop interpolation, with
the input row and the second row each including [(M/N−1)×N] interpolation resistors connected in series at [((M/N−1)×N)+1] nodes.

15. The circuit of claim 12, wherein the input row and the second row are configured for closed loop interpolation, with
the input row and the second row each including (M) interpolation resistors connected in series at (M) nodes.

16. The circuit of claim 12, wherein the interpolation resistors do not all have the same resistance value.

17. The circuit of claim 12, wherein the input value is a differential input value, the interpolation resistors are differential interpolation resistors, and the amplifier stage is a differential amplifier stage with M differential amplifiers or 2×M single-ended amplifiers.

18. The circuit of claim 12, further comprising multiple cascaded amplifier array stages:
- each amplifier array stage comprising the amplifier array and the resistor interpolator;
- each amplifier array stage except the last interpolation stage having its output nodes coupled as inputs to respective amplifiers of a next amplifier array stage.

19. The circuit of claim 12, wherein:
- the amplifier stage is configured with folding factor of three; and
- the resistor interpolator is configured with an interpolation order of three.

* * * * *